(12) United States Patent
Gupta

(10) Patent No.: US 8,798,044 B2
(45) Date of Patent: Aug. 5, 2014

(54) ORTHOGONAL CHANNEL DATA SWITCH

(75) Inventor: Atul Krishna Gupta, Aliso Viejo, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 487 days.

(21) Appl. No.: 13/095,660

(22) Filed: Apr. 27, 2011

(65) Prior Publication Data

US 2012/0274383 A1    Nov. 1, 2012

(51) Int. Cl.
*H04Q 11/00*    (2006.01)
(52) U.S. Cl.
USPC ............ 370/386; 370/358; 370/359; 370/360
(58) Field of Classification Search
USPC .......... 370/351, 357, 359, 386; 257/202, 368; 327/403; 345/67; 361/56
See application file for complete search history.

(56) References Cited

U.S. PATENT DOCUMENTS

| | | | | |
|---|---|---|---|---|
| 5,615,073 | A * | 3/1997 | Fried et al. ...................... | 361/56 |
| 5,936,285 | A * | 8/1999 | Pasch et al. .................... | 257/368 |
| 6,437,632 | B1 * | 8/2002 | Goko ............................. | 327/403 |
| 2005/0285819 | A1 * | 12/2005 | Onozawa et al. ............... | 345/67 |
| 2007/0228419 | A1 * | 10/2007 | Komaki ......................... | 257/202 |

\* cited by examiner

*Primary Examiner* — Hassan Kizou
*Assistant Examiner* — Toan Nguyen
(74) *Attorney, Agent, or Firm* — Weide & Miller, Ltd.

(57) ABSTRACT

An integrated circuit device for switching data has a plurality of input channels and a plurality of output channels. The device includes a switch for selectively connecting a subset of the output channels, mutually orthogonal, to the input channels by providing signal paths between the selected mutually orthogonal output channels and the input channels. The selected output channels are not orthogonal to the output channels that are not selected.

23 Claims, 5 Drawing Sheets

ORTHOGONAL CHANNEL DATA SWITCH

TECHNICAL FIELD

The invention relates generally to integrated circuits, and more particularly to an orthogonal channel data switch.

BACKGROUND

Data switches are frequently used to selectively route data between a plurality of input and output channels. FIG. 1 illustrates a typical four channel data switch 100. The data switch 100 includes four input channels designated by A0, A1, A2 and A3, each input channel comprising a positive and a negative terminal. The data switch 100 includes eight output channels designated by B0, B1, B2, B3 C0, C1, C2, and C3, each output channel comprising a positive and a negative terminal.

A selector switch 104 selectively connects only one of the two groups of output channels, the first group of output channels comprising B0, B1, B2 and B3 and the second group of output channels comprising C0, C1, C2 and C3, to the input channels A0, A1, A2 and A3. In operation, either the first or the second group of output channel remains active.

FIG. 2 illustrates the data switch 100 implemented in a typical 42 pin package 200. The package 200 includes four input channels designated by A0, A1, A2 and A3, each input channel comprising a positive and a negative terminal. The package 200 also includes eight output channels designated by B0, B1, B2, B3 C0, C1, C2, and C3, each output channel comprising a positive and a negative terminal.

Consider, for example, that the selector switch 104 selectively connects the first group of output channels comprising B0, B1, B2, and B3 to the input channels A0, A1, A2, and A3. Thus, during operation, the first group of output channels remains active while the second group of output channels comprising C0, C1, C2, and C3 remains inactive. Since the input channels A0 and A1 are adjacent to each other, during operation cross-talk occurs between the input channels A0 and A1. Also, cross-talk occurs between the input channels A2 and A3 because of their adjacent location. Similarly, since the output channels B0 and B1 are adjacent to each other, cross-talk occurs between the output channels B0 and B1. Also, cross-talk occurs between the output channels B2 and B3. It will be appreciated that the cross-talk between the input channels and also between the output channels degrades the performance of the package 200.

SUMMARY

An embodiment of the present invention provides an integrated circuit device for routing data. The device includes a plurality of mutually orthogonal input channels and a plurality of output channels. The device includes a switch for selectively connecting a subset of the output channels to the input channels. The selected output channels are mutually orthogonal. The selected output channels are not orthogonal to the de-selected output channels.

Another embodiment of the integrated circuit device provides that the input and output channels each comprise a positive and a negative terminal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
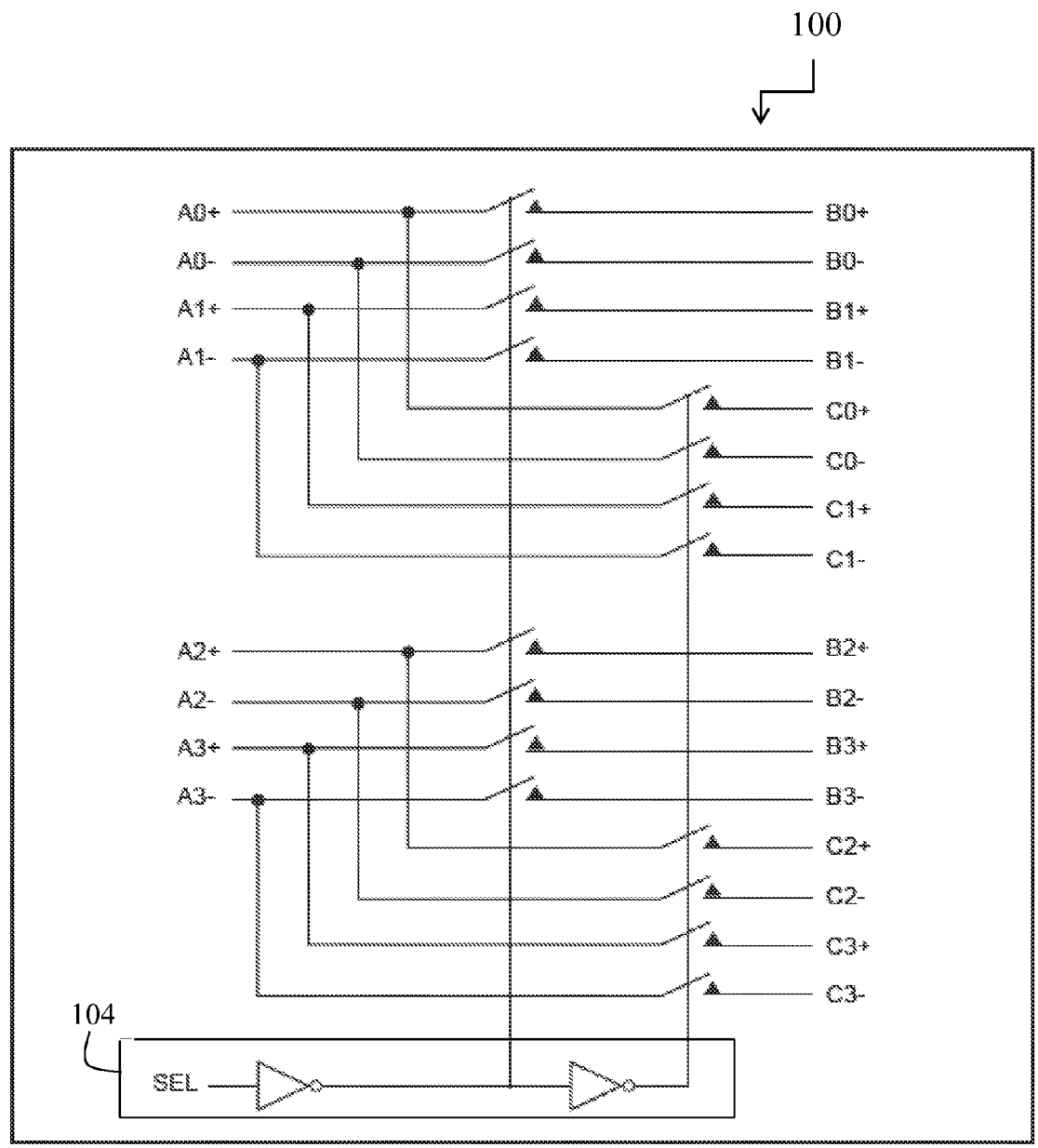
FIG. 1 illustrates a four channel data switch.
Figure 2:
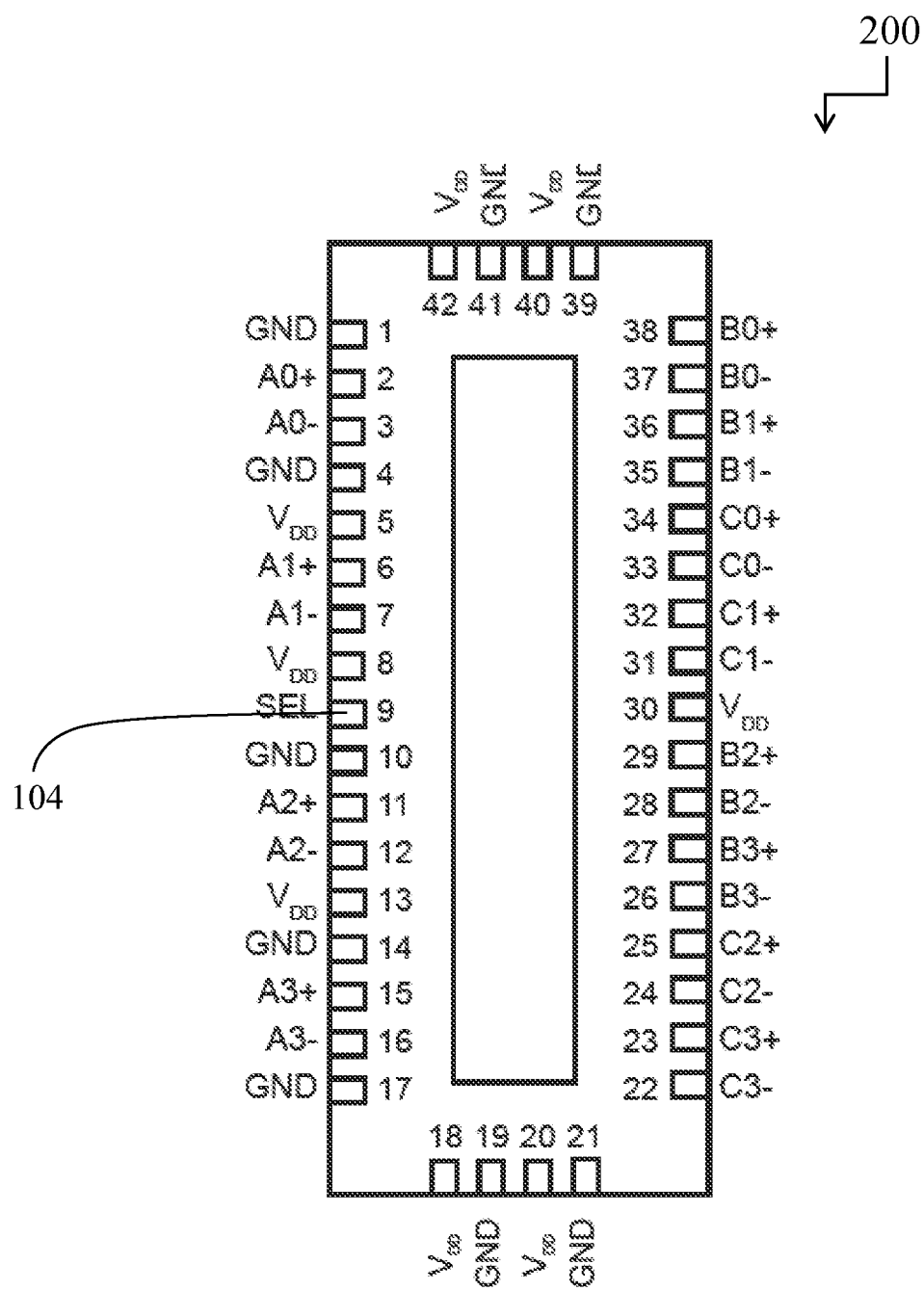
FIG. 2 illustrates a data switch implemented in a 42 pin package.
Figure 3:
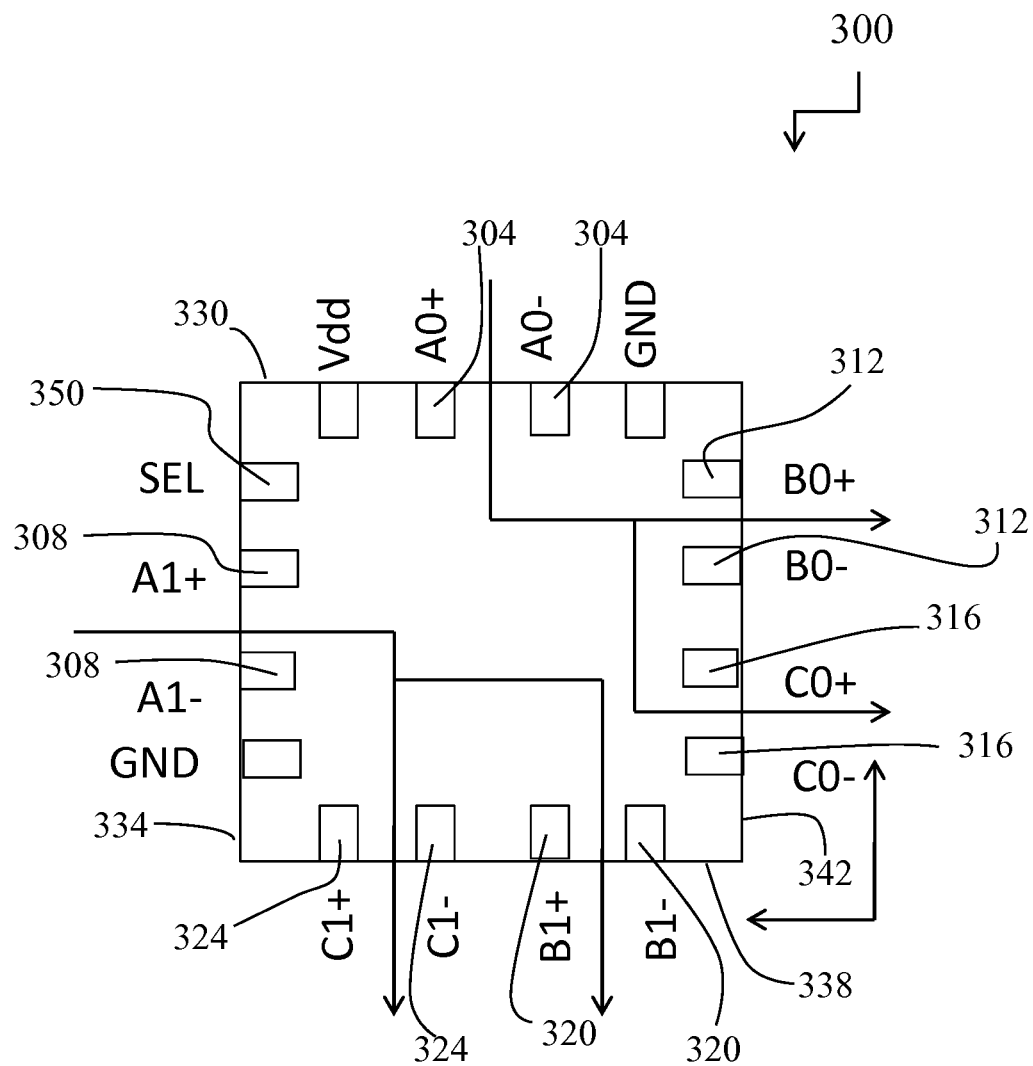
FIG. 3 illustrates a layout of an integrated circuit device in accordance with one embodiment of the invention.

FIG. 3 illustrates a layout of an integrated circuit device 300 in accordance with one embodiment of the invention. The device 300 includes first and second input channels 304 and 308. The input channel 304 includes positive and negative terminals A0+ and A0−, and the input channel 308 includes positive and negative terminals A1+ and A1−.

The device 300 includes four output channels 312, 316, 320, and 324. The output channel 312 includes positive and negative terminals B0+ and B0−, the output channel 316 includes positive and negative terminals C0+ and C0−, the output channel 320 includes positive and negative terminals B1+ and B1−, and the output channel 324 includes positive and negative terminals C1+ and C1−.

The first and second input channels 304 and 308 are mutually orthogonal. The word "orthogonal" or the phrase "mutually orthogonal" indicates that the two input channels 304 and 308 are not located on the same side of the device 300 but are located on mutually perpendicular sides. By way of example, referring to FIG. 3, the four sides of the device 300 are designated by reference numerals 330, 334, 338 and 342. Sides 330 and 334 are mutually perpendicular or orthogonal. Sides 330 and 338 are parallel, and are thus not mutually perpendicular or orthogonal. The input channel 304 is located on the side 330 and the input channel 308 is located on the side 334. Thus the input channels 304 and 308 are considered mutually orthogonal because they are located on mutually orthogonal sides.

The device 300 includes a selector switch 350 for selectively connecting two of the output channels, mutually orthogonal, to the input channels 304 and 308. The selector switch 350 provides signal paths between the selected output channels and the input channels. The selector switch 350 may select the output channels 312 and 320, which are mutually orthogonal, for connection with the input channels 304 and 308. More specifically, the selector switch may connect the output channel 312 to the input channel 304 and may connect the output channel 320 to the input channel 308. The respective positive terminals of the output channel and the input channel to which the output channel connects are interconnected. Similarly, the respective negative terminals of the output channel and input channel to which the output channel connects are interconnected. Thus, B0+ is connected to A0+ and B0− is connected to A0−. Similarly, B1+ is connected to A1+ and B1− is connected to A1−. Alternatively, the output channel 316 may be connected to the input channel 304 and the output channel 324 may be connected to the input channel 308 in the same manner described above.

It will be appreciated that the selected output channels, which are also referred to as active output channels, are not orthogonal to one of the de-selected (i.e., not selected) output channels, which are also referred to as inactive output channels. Since the device 300 includes two output channels 312 and 316 on the side 342 and two output channels 320 and 324 on the side 338, selection of only one output channel on each side allows the active output channel to be on the same side of, i.e., not orthogonal to, an inactive channel. Thus, in operation, an active output channel is always on the same side of, i.e., not orthogonal to, an inactive output channel. For example, if the output channels 312 and 320 are selected for connection to the input channels 304 and 308, the output channel 316, which is inactive, is adjacent to the output channel 312, which is active. Similarly, the output channel 320, which is active, is adjacent to the output channel 324, which is inactive. Also, as a result, there always exists an inactive output channel between two active output channels.

Referring to FIG. 3, in operation, the output channel 316, which is inactive, is between two active output channels 312 and 320. Alternatively, if the channels 316 and 324 are selected, the channel 320, which is inactive, exists between the two active output channels. Thus, the selection rules provide that there is always an inactive output channel between two active output channels.

Figure 4:
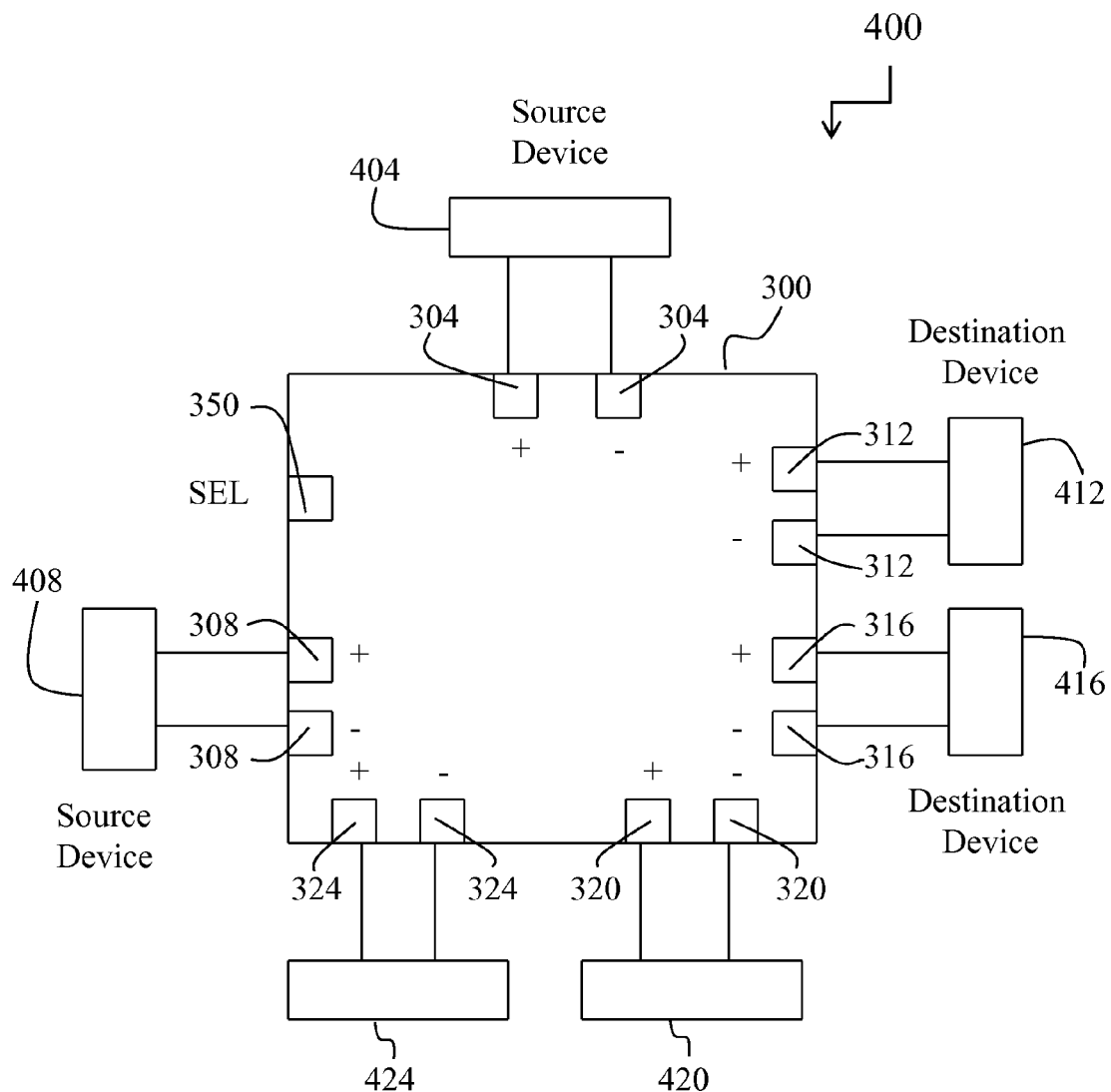
FIG. 4 illustrates a system for selectively routing signals from source devices to destination devices.

FIG. 4 illustrates a system 400 for selectively routing signals from source devices 404 and 408 to destination devices 412, 416, 420, and 424 via the device 300. The source devices 404 and 408 are connected to the input channels 304 and 308, respectively. The destination devices 412, 416, 420, and 424 are connected to the output channels 312, 316, 320, and 324, respectively. As discussed before, a switch selectively connects a subset of the output channels, mutually orthogonal, to the input channels by providing signal paths between the selected mutually orthogonal output channels and the input channels.

The invention reduces coupling between two active output channels because they are mutually orthogonal. Also, the invention reduces coupling between two active output channels due to the presence of an inactive output channel between the two active channels. Also, the invention reduces coupling between the input channels because the input channels are mutually orthogonal.

Figure 5:
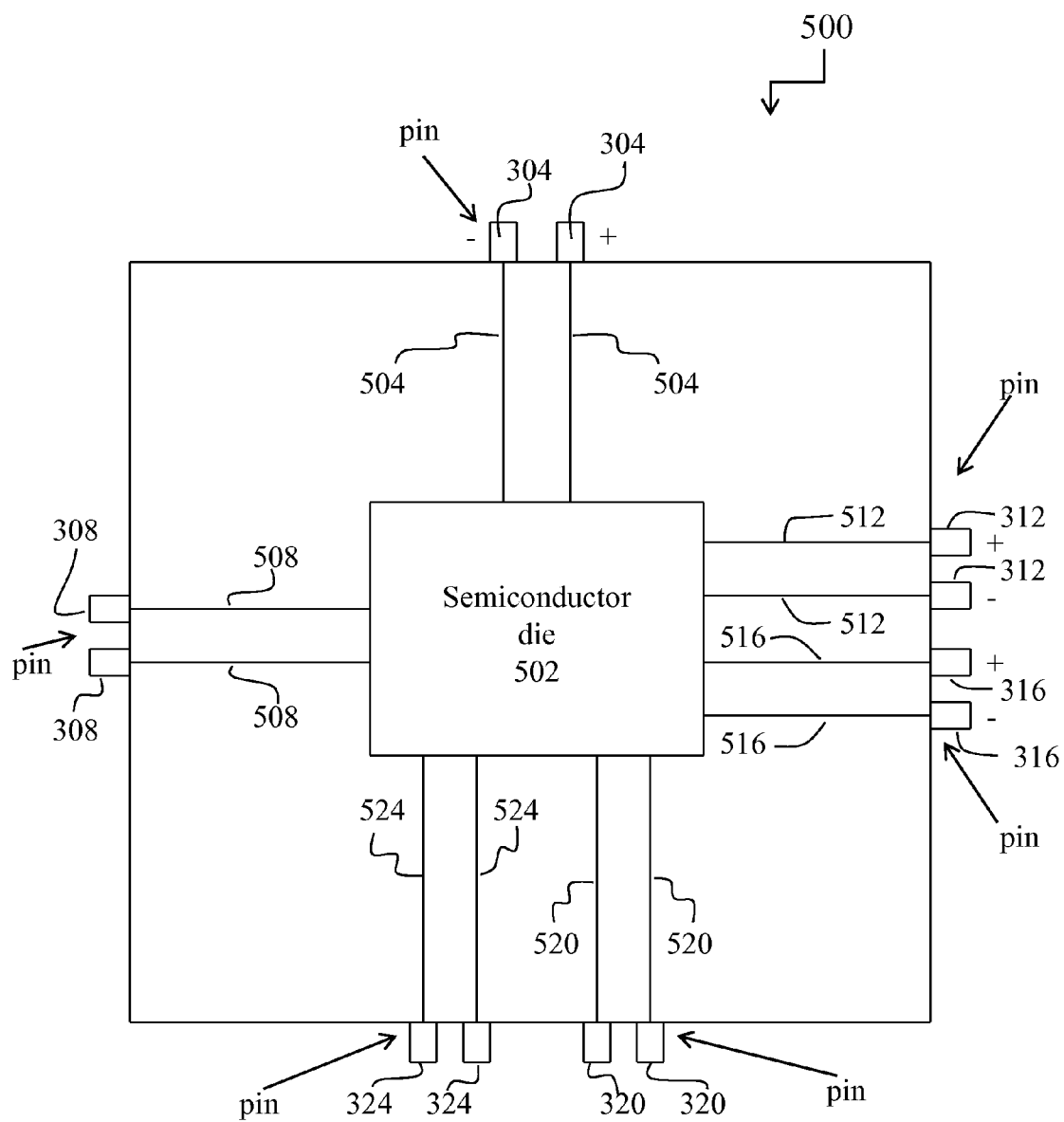
FIG. 5 illustrates an implementation of an embodiment of the invention.

FIG. 5 illustrates an implementation of an embodiment of the invention in a package 500. The package 500 includes a die 502 that is connected to pins via a plurality of bondwires. By way of example, bondwires 504 connect the die 502 to pins of the input channel 304 and bondwires 508 connect the die 502 to pins of the input channel 308. Similarly, bondwires 512 connect the die 502 to pins of the output channel 312, bondwires 516 connect the die 502 to pins of the output channel 316, bondwires 520 connect the die 502 to pins of the output channel 320, and finally bondwires 524 connect the die 502 to pins of the output channel 324.

Consider, for example, that the selector switch (not shown in FIG. 5) selects the output channels 312 and 320. Since the output channels 312 and 320 are mutually orthogonal, the corresponding bondwires 512 and 520 are also mutually orthogonal. As a result, coupling between the active output channels is further reduced. Similarly, since the bondwires 504 and 508 are mutually orthogonal, coupling between the input channels is further reduced.

It will be apparent that the foregoing disclosure can be expanded to any combination of input and output channels. While the embodiments illustrate only two input channels and two output channels, the invention may be implemented with more than two output channels and more than two input channels.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of embodiments. Accordingly, it is appropriate that the appended claims be construed broadly and in a manner consistent with the scope of the invention.

The invention claimed is:

1. An integrated circuit device, comprising:
a plurality of mutually orthogonal input channels;
a plurality of output channels, the input channels and the output channels each comprising a positive and a negative terminal; and
a switch for selectively connecting a subset of the output channels to the input channels, wherein the selected subset of the output channels are mutually orthogonal and the switch connects the positive terminal of the output channel to the positive terminal of the input channel and connects the negative terminal of the output channel to the negative terminal of the input channel.

2. The integrated circuit device of claim 1 further comprising a plurality of selected output channels that are each orthogonal to the input channel to which it is connected.

3. The integrated circuit device of claim 1, wherein the input channels each comprise a positive and a negative terminal.

4. The integrated circuit device of claim 1, wherein the output channels each comprise a positive and a negative terminal.

5. The integrated circuit device of claim 1, wherein the selected output channels are not orthogonal output channels that are not selected.

6. An integrated circuit device, comprising:
first and second mutually orthogonal input channels;
four output channels, the input channels and the output channels each comprising at least one positive terminal and at least one negative terminal; and
a switch for selectively connecting two of the output channels to the input channels, wherein the selected output channels are mutually orthogonal and the switch connects at least one positive terminal of the output channel to at least one positive terminal of the input channel and connects at least one negative terminal of the output channel to at least one negative terminal of the input channel.

7. The integrated circuit device of claim 6, wherein the two selected output channels are each orthogonal to the input channel to which they are connected.

8. The integrated circuit device of claim 6, wherein the input channels each comprise a positive and a negative terminal.

9. The integrated circuit device of claim 6, wherein the output channels each comprise a positive and a negative terminal.

10. The integrated circuit device of claim 6, wherein the two selected output channels are not orthogonal to the output channels that are not selected.

11. A system for routing signals, comprising:
a plurality of source devices each operable to generate a respective signal;
a plurality of destination devices each configured to receive one of the signals;
an integrated circuit device, comprising:
a plurality of mutually orthogonal input channels each connected to one of the source devices;
a plurality of output channels each connected to one of the destination devices, the input channels and the output channels each comprise a positive and a negative terminal; and
a switch for selectively connecting a subset of the output channels to the input channels, wherein the selected output channels are mutually orthogonal and the switch connects the positive terminal of the output channel to the positive terminal of the input channel and connects the negative terminal of the output channel to the negative terminal of the input channel.

12. The system of claim 11, wherein the selected output channels are each orthogonal to the input channel to which it is connected.

13. The system of claim 11, wherein the input channels each comprise a positive and a negative terminal.

14. The system of claim 11, wherein the output channels each comprise a positive and a negative terminal.

15. The system of claim 11, wherein the selected output channels are not orthogonal to the de-selected output channels.

16. A system for routing signals, comprising:
a plurality of source devices each operable to generate a respective signal;
a plurality of destination devices each configured to receive one of the signals;
an integrated circuit device, comprising:
first and second mutually orthogonal input channels each connected to one of the source devices;
four output channels each connected to one of the destination devices such that the input channels and the output channels each comprise a positive terminal and a negative terminal; and
a switch for selectively connecting two of the output channels to the input channels, wherein the selected output channels are mutually orthogonal and the switch connects the positive terminal of the output channel to the positive terminal of the input channel and connects the negative terminal of the output channel to the negative terminal of the input channel.

17. The system of claim 16, wherein the selected output channels are each orthogonal to the input channel to which it is connected.

18. The system of claim 16, wherein the input channels each comprise a positive and a negative terminal.

19. The system of claim 16, wherein the output channels each comprise a positive and a negative terminal.

20. The system of claim 16, wherein the selected output channels are not orthogonal to the de-selected output channels.

21. An integrated circuit device, comprising:
a plurality of input channels;
a plurality of output channels such that the plurality of input channels and the plurality of output channels each comprise at least one positive terminal and at least one negative terminal; and
a switch for selectively connecting a subset of input channels to a subset of output channels, wherein the selected subset of input channels are mutually orthogonal and the selected subset of output channels are mutually orthogonal and the switch connects at least one positive terminal of the plurality of output channels to at least one positive terminal of the plurality of input channels and connects at least one negative terminal of the plurality of output channels to at least one negative terminal of the plurality of input channels.

22. The integrated circuit device of claim 21, wherein the selected output channels are each orthogonal to the input channel to which it is connected.

23. The integrated circuit device of claim 21, wherein the selected output channels are not orthogonal to the output channels that are not selected.

* * * * *